United States Patent
Mukund et al.

(10) Patent No.: US 7,614,020 B2
(45) Date of Patent: Nov. 3, 2009

(54) STRUCTURALLY FIELD-CONFIGURABLE SEMICONDUCTOR ARRAY FOR IN-MEMORY PROCESSING OF STATEFUL, TRANSACTION-ORIENTED SYSTEMS

(75) Inventors: Shridhar Mukund, San Jose, CA (US); Anjan Mitra, Santa Clara, CA (US)

(73) Assignee: iKoa Corporation, Menlo Park, CA (US)

( * ) Notice: Subject to any disclaimer, the term of this patent is extended or adjusted under 35 U.S.C. 154(b) by 179 days.

(21) Appl. No.: 11/426,880

(22) Filed: Jun. 27, 2006

(65) Prior Publication Data

US 2006/0294483 A1 Dec. 28, 2006

Related U.S. Application Data

(60) Provisional application No. 60/694,538, filed on Jun. 27, 2005, provisional application No. 60/694,546, filed on Jun. 27, 2005, provisional application No. 60/694,537, filed on Jun. 27, 2005.

(51) Int. Cl.
*G06F 17/50* (2006.01)
(52) U.S. Cl. .................. 716/1; 716/16; 716/17
(58) Field of Classification Search .......... 716/1, 716/7–12, 16–18; 711/106, 158, 6, 100–101, 711/157; 717/104, 119, 127
See application file for complete search history.

(56) References Cited

U.S. PATENT DOCUMENTS

| | | | |
|---|---|---|---|
| 6,567,837 B1 | 5/2003 | Robinson | |
| 2003/0177320 A1* | 9/2003 | Sah et al. | 711/158 |
| 2004/0250254 A1 | 12/2004 | Frank et al. | |
| 2004/0264279 A1* | 12/2004 | Wordeman et al. | 365/230.05 |
| 2005/0111251 A1* | 5/2005 | Liaw | 365/154 |
| 2006/0145738 A1* | 7/2006 | Heinkel et al. | 327/141 |
| 2007/0086918 A1* | 4/2007 | Hartley et al. | 422/73 |
| 2007/0290318 A1* | 12/2007 | Tao et al. | 257/686 |

* cited by examiner

*Primary Examiner*—Paul Dinh
(74) *Attorney, Agent, or Firm*—Martine Penilla & Gencarella, LLP

(57) ABSTRACT

A semiconductor memory device is provided. The semiconductor memory device includes a plurality of memory cells arranged in multiple column groups, each column group having, a plurality of columns and a plurality of external bit-lines for independent multi-way configurable access. The column group having a first, second, and third level of hierarchy in the external bit-lines. The first level of the hierarchy provides connectivity to the plurality of memory cells. The second level of the hierarchy provides a first splicer for multiplexing data to and from each of the columns in the column group to an intermediate bit-line. The third level of the hierarchy includes a second splicer for multiplexing data to and from multiple external access paths to the intermediate bit-line. A structurally reconfigurable circuit device and methods for designing a circuit are also provided.

17 Claims, 12 Drawing Sheets

| Type | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|
| Compact Operation | 0 | R | OPCO | | | P1 | ARGC | | | PR | | ARGR | | | | P2 | | ARG1 | | | | ARG2 | | | | | | | | | | |
| Extended Operation | 1 | 0 | R | OPEO | | | P1 | ARGC | | | PR | ARGR | | | | | P2 | ARG1 | | | | ARG2 | | | | | | | | | | |
| Compact Control | 1 | 1 | 0 | OPCC | | | P1 | ARGC | | | OFST | | | | | | P2 | ARG1 | | | | ARG2 | | | | | | | | | | |
| Lockup Operation | 1 | 1 | 1 | 0 | OPLO | | | ARGC | | | PR | ARGR | | | | | P2 | ARG1 | | | | ARG2 | | | | | | | | | | |
| Long Control | 1 | 1 | 1 | 1 | 0 | OPLC | | IMM1 | | | | | | | | | OFST | | | | | IMM2 | | | | | | | | | | |
| Immediate Operation | 1 | 1 | 1 | 1 | 1 | 0 | OPIO | | IMM1 | | | | | PR | ARGR | | | | IMM2 | | | | | | | | | | | | | |

| | | | |
|---|---|---|---|
| P: Input Signal Pointer | | P1: { P | SP }, { P | SP | RP | 0 } | Reference Pointer for First ALU Operand |
| OP: Output Signal Pointer | | P2: { MP | SP | RP | MM } | Reference Pointer for Second ALU Operand |
| SP: Stack Pointer | | PR: { OP | SP | WP | 0 } | Reference Pointer for Result |
| RP: Auto-Incrementable Read Pointer | | ARG1, ARG2, ARGR | Input and Result arguments or offsets |
| WP: Auto-Incrementable Write Pointer | | ARGC | Constant argument with respect to OP |
| MP: Module Pointer | | OFST | Typically address offset |
| AR: Accumulator | | IMM{IMM1&IMM2} | Typically address/data immediate value |
| SR: Status { Z, NZ, C, NG, PO, ... } | | R | Return if set |
| EP: Extension Pointer, Mask, Align etc. | | OPCO, OPEO, OPCB, OPLI | Opcodes |

| $(EP+ARGC) : { MASK[32], ALGN2[6], ALGNR[6], RP++[1], RSTRIDE[4], WP++[1], WSTRIDE[4], SHFT[1], RSVD[9] } | |
|---|---|
| MASK | Mask ALU Operation and the Result Write |
| ALGN2 | Align Second Operand by +/- 32 bits |
| ALGNR | Align Result by +/- 32 bits |
| RP++ | Auto-Increment RP by RSTRIDE |
| WP++ | Auto-Increment WP by WSTRIDE |
| SHFT | Bit to be shifted in for the shift instruction |

OPCO: { and | or | xor | add | sub | min | max | ... }
OPEO: { and | or | xor | add | addc | addsat | ... }     addsat - add and saturate to +MAX/-MIN, if overflow
OPCC: { and_jz | xor_jz | cmp_jgt | cmp_jlt | add_jc | switch | ... }
OPLO: { crc32, crc16, aes?, ..., aes?, cmult32, cmult16, cmult8, ... }
OPLC: { call | return | jr | jz | jc | ja | ...}
OPIO: { loadi | loadu | ...}

STRUCTURALLY FIELD-CONFIGURABLE SEMICONDUCTOR ARRAY FOR IN-MEMORY PROCESSING OF STATEFUL, TRANSACTION-ORIENTED SYSTEMS

CLAIM OF PRIORITY

The present application claims priority under 35 U.S.C. § 119(e) from U.S. Provisional Patent Application No. 60/694,538, filed Jun. 27, 2005, U.S. Provisional Patent Application No. 60/694,546, filed Jun. 27, 2005, and U.S. Provisional Patent Application No. 60/694,537, filed Jun. 27, 2005, all of which are incorporated by reference in their entirety for all purposes. The present application is related to U.S. application Ser. No. 11/426,887 entitled APPARATUS FOR PERFORMING COMPUTATIONAL TRANSFORMATIONS AS APPLIED TO IN-MEMORY PROCESSING OF STATEFUL, TRANSACTION ORIENTED SYSTEMS, and U.S. application Ser. No. 11/426,882 entitled METHOD FOR SPECIFYING STATEFUL, TRANSACTION-ORIENTED SYSTEMS FOR FLEXIBLE MAPPING TO STRUCTURALLY CONFIGURABLE, IN-MEMORY PROCESSING SEMICONDUCTOR DEVICE, filed on the same day as the instant application, and each of which are incorporated by reference in their entirety for all purposes.

BACKGROUND

System on a chip (SOC) implementation is predominantly based on design capture at the register-transfer level using design languages such as Verilog and VHDL, followed by logic synthesis of the captured design and placement and routing of the synthesized netlist in physical design. Current efforts to improve design productivity have aimed at design capture at a higher level of abstraction, via more algorithmic/system approaches such as C++, C, SystemC and System Verilog.

As process technology advances, physical design issues such as timing closure and power consumption management have dominated the design cycle time as much as design capture and verification. Methodology advances currently in development and under consideration for adoption using higher levels of abstraction in design capture do not address these physical design issues, and manufacturability issues. It is recognized in the semiconductor industry that with process technologies at 90 nm and below, physical design issues will have even more significant cost impacts in design cycle time and product quality.

CAD tools for placement and route of synthesized logic netlists have delivered limited success in addressing the physical design requirements of deep submicron process technologies. To take full advantage of deep submicron process technology, the semiconductor industry needs a design methodology and a supporting tool suite that can improve productivity through the entire design cycle, from design capture and verification through physical design, while guaranteeing product manufacturability at the same time. It is also well-known in the semiconductor industry that SOC implementations of stateful, transaction-oriented applications depend heavily on on-chip memory bandwidth and capacity for performance and power savings. Placement and routing of a large number of memory modules becomes another major bottleneck in SOC physical design.

Another important requirement for an advanced SOC design methodology for deep submicron process technology is to allow integration of on-chip memory with significant bandwidth and capacity without impacting product development schedule or product manufacturability. High level design capture, product manufacturability, and support for significant memory resources are also motivating factors in the development of processor-in-memory. Processor-in-memory architectures are driven by requirements to support advanced software programming concepts such as virtual memory, global memory, dynamic resource allocation, and dynamic load balancing. The hardware and software complexity and costs of these architectures are justified by the requirement to deliver good performance for a wide range of software applications. Due to these overheads, multiple processor-in-memory chips are required in any practical system to meet realistic performance and capacity requirements, as witnessed by the absence of any system product development incorporating a single processor-in-memory chip package.

There is thus an added requirement for cost effective SOC applications that resource management in processor-in-memory architectures be completely controllable by the designer through program structuring and annotations, and compile-time analysis. It is also important to eliminate all cost and performance overheads in software and hardware complexity attributed to the support of hierarchical memory systems. Based on these observations, there is a need in the semiconductor industry for a cost-effective methodology to implementing SOCs for stateful, transaction-oriented applications.

SUMMARY

Broadly speaking, the present invention fills these needs by providing a method and apparatus for in-memory processing of stateful, transaction-oriented applications. It should be appreciated that the present invention can be implemented in numerous ways, including as a process, an apparatus, a system, or a device. Several inventive embodiments of the present invention are described below.

In one embodiment, a structurally reconfigurable semiconductor circuit device for in-memory processing of stateful, transaction-oriented applications is provided. The circuit device includes a multiple level array of memory storage cells and logic circuits. The storage cells have multiple configurable access paths and are capable of being simultaneously accessed for being read from and written into. The circuit device also includes a plurality of configurable, packetized interface ports capable of receiving data packets. The packetized interface ports have access to the multiple level array. A plurality of configurable commute elements distributed within the multiple level array are included. Each of the plurality of configurable commute elements is configured to move data within the multiple level array of storage cells through one of the multiple configurable access paths. The circuit device also includes a plurality of configurable Compute elements within the multiple level array. Each of the plurality of configurable Compute elements is configured to transform data within a portion of the multiple level array of storage cells via the multiple configurable access paths.

In another embodiment, a semiconductor memory device is provided. The semiconductor memory device includes a plurality of memory cells arranged in multiple column groups, each column group having, a plurality of columns and a plurality of external bit-lines for independent multi-way configurable access. The column group having a first, second, and third level of hierarchy in the external bit-lines. The first level of the hierarchy provides connectivity to the plurality of memory cells. The second level of the hierarchy provides a first splicer for multiplexing data to and from each of the columns in the column group to an intermediate bit-line. The third level of the hierarchy includes a second splicer for multiplexing data to and from multiple external access paths to the intermediate bit-line.

In yet another embodiment, a method for designing a circuit device and a layout in a manner to enhance yield of the circuit device during manufacturing is provided. The method initiates with partitioning a physical design of the circuit device into different hierarchical levels of integration. A pool of redundant features for the different hierarchical levels of integration is provided, wherein the pool of redundant features is apportioned to the different hierarchical levels of integration according to a defect density of each of the levels of integration.

In still another embodiment, a method to enhance soft error robustness of a semiconductor circuit device having a multiple level array of memory storage cells is provided. The method initiates with isolating a read access path coupled to a memory storage cell of the multiple level array of memory storage cells. A charge of the memory storage cell is increased, that is in addition to a gate capacitance provided by a gate of the memory storage cell. A diffusion area of a gate region of the memory storage cell is then reduced, thereby reducing the SER (Soft Error) cross section.

In another embodiment, a method for configuring and programming a semiconductor circuit device having a multiple level array of memory storage cells is provided. The method initiates with expressing a stateful transaction oriented application as a network of flow virtual machines (FVMs), each of the FVMs is associated with a portion of a configurable memory region. The method includes aggregating multiple FVMs into an aggregate flow virtual machine (AFVM) and mapping the AFVM into a portion of the multiple level array of memory storage cells. Multi-way access paths of the multiple level array are configured according to the multiple FVMs and the portion of the multiple level array is programmed to function according to the multiple FVMs.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 14 illustrates the instruction set architecture of the Compute element in accordance with one embodiment of the invention.

DETAILED DESCRIPTION

An invention is described for a structurally reconfigurable intelligent memory device for efficient implementation of stateful, transaction-oriented systems in silicon. It will be obvious, however, to one skilled in the art, that the present invention may be practiced without some or all of these specific details. In other instances, well known process operations have not been described in detail in order not to unnecessarily obscure the present invention.

The embodiments of the present invention described below provide a method and apparatus enabling flexible design capture methodology which allows a designer to select the granularity at which a stateful, transaction-oriented application is captured. An efficient methodology to implement a stateful, transaction-oriented application on a platform economically superior with respect to design effort, implementation costs and manufacturability is further described below. The embodiments utilize an execution model that allows for efficient compiler optimization and resource allocation, efficient hardware implementation, and accurate performance analysis and prediction when a design is captured and analyzed. It should be appreciated that no significant uncertainty is introduced by design compilation, mapping into the physical platform, or resource conflicts during system operation. The resource requirements are specified explicitly when the design is captured, using annotations or compiler analysis. Allocation of hardware resources can be determined statically at compile time.

In another aspect of the invention a simple and effective chip architecture that uses a single level real memory organization to eliminate the costs of managing a caching hierarchy associated with virtual memory systems in applications development, compiler optimization, run-time system support, and hardware complexity is provided. As will be explained in more detail below, the embodiments described herein meet the tremendous demands of memory capacity and bandwidth in future generation SOCs with solutions that are economical in die area, product development cycle and power consumption. At the same time, the embodiments reap the cost, performance and power consumption benefits of advanced deep submicron fabrication processes with exceedingly high manufacturability and reliability.

Figure 1:
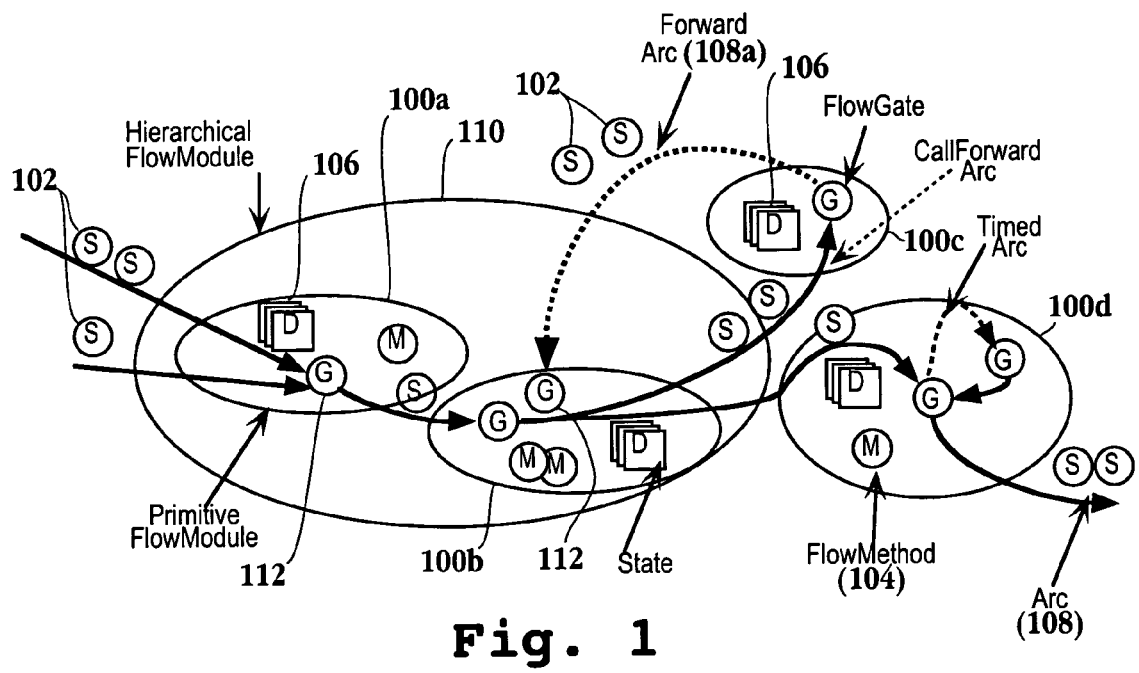
FIG. 1 is a high-level simplified schematic diagram of FlowModules in accordance with one embodiment of the invention.

FIG. 1 is a high-level simplified schematic diagram of FlowModules in accordance with one embodiment of the invention. FlowModules 100a through 100d represent objects in accordance with one embodiment of the invention. FlowModules 100a through 100d are mostly comprised of memory arrays in this embodiment. FlowModule 100a includes FlowMethod 104, States 106, and FlowGate 112. Signals 102 are processed and commuted between FlowModules through FlowGates 112. Signals 102, which may be referred to as messages, are in packet format in one embodiment of the invention. The primary inputs and outputs into the FlowLogic architecture are also Signals. Arc 108 represents a channel through which data flows between FlowGates 112. In one embodiment, Arcs 108 represent queues and Signals 102 are transmitted through Arcs 108. FlowModules 100 represent objects, defining codes and data allocated to memory. FIG. 1 further illustrates FlowModule 100a and FlowModule 100b within hierarchical FlowModule 110. FlowModule 100a and FlowModule 100b are grouped within hierarchical FlowModule 110 for convenience in one embodiment. In other words, the grouping of FlowModule 100a and FlowModule 100b may be analogized to an alias. Arcs 108 may be characterized as a ForwardArc 108a, a CallForwardArc 108b or a TimedArc 108c in one embodiment. The details for these types of Arcs are provided below. It should be appreciated that Arcs 108 are created in application-specific fashion. FlowGates 112 are invoked through an external Signal and are akin to a function call.

Still referring to FIG. 1, PrimitiveFlowModules, henceforth referred as FlowModules 100a-d, are concurrent entities that include FlowGates 112, States 106, and FlowMethods 104. Arcs 108 emanate from a FlowGate and terminate at a FlowGate. An Arc can carry one or more Signals at a given time. A FlowGate is invoked by a Signal instance, i.e., a Signal instance is targeted to invoke a specific FlowGate. In one embodiment, a Signal instance is a stream of bytes that carries necessary arguments which may be a small message or a large packet or of any size in between. A Signal also may carry a priority-class attribute. Signals within a class (priority-class) are guaranteed to arrive in the order they were generated at the head of the Arc. It should be appreciated that FlowGate 112 does not have a state of its own. FlowGate 112 can modify the state of the FlowModule it resides in and the FlowGates may generate one or more Signals and thereby invoke one or more FlowGates concurrently. In one embodiment, FlowGate 112 may be thought of as an indivisible and un-interruptible sequence of procedural code that typically terminates after a short burst of execution. FlowLogic guarantees that one and only one FlowGate within a FlowModule is active at any time and a FlowGate once started is guaranteed to complete. FlowMethods, as used herein, are sequential bodies of code, e.g., C style function calls that the FlowGates within a FlowModule may use to achieve their end goals. Hierarchical FlowModules comprise one or more FlowModules 100a-d, and are largely used to facilitate FlowLogic code reuse and interface specification exchange. A TimedArc is a special case of an Arc, where the constituent Signals carry a Timer. The constituent Signals in a TimedArc will invoke corresponding FlowGate out-of-order as and when the Timer expires. In one embodiment, TimedArcs are specifically constrained to originate and terminate within the same FlowModule. A ForwardArc is another special case of an Arc 108 whose destination is implied by Signals carried by a CallForwardArc. It should be appreciated that the notion of threads or processors does not exist in the FlowLogic description. FlowLogic can be thought of as a set of interacting pipelines of Signal flows.

One skilled in the art will appreciate from FIG. 1 that the FlowLogic architecture can be used to describe an arbitrary transaction-oriented application using an arbitrary number of interconnected FlowLogic components. Isochronous systems can also be described with reasonable timing resolution. It should be noted that FlowLogic is not meant for traditional digital logic system design where cycle accuracy and deterministic behavior is paramount. Systems designed using FlowLogic are non-deterministic, but can have well-known end-to-end functional behavior independent of the delays in the Arc. Arcs are guaranteed not to drop Signals unless they are attributed specifically to do so. The quantitative or performance behavior of the system may change depending on the parameters of the Arcs, including delay (latency), capacity, priority and so forth.

The FlowLogic architecture allows flexible design space exploration of performance and quantitative behavior, followed by flexible mapping of the results into the said structurally field-configurable semiconductor device. The parameters related to Arcs 108, among others, are determined interactively during system simulations using FlowLogic. It may be noted that the performance behavior of such systems will only be as good as the traffic pattern assumptions made in the simulation. In one embodiment, FlowGates referred to as DynamicFlowGates can be dynamically loaded and linked at run-time. In one embodiment, DynamicFlowGates are limited to serving the purposes of run-time system diagnostics and debug. Thus, an overview of the FlowLogic system and language has been provided above and further details are provided with reference to the Figures referenced below.

Figure 2:
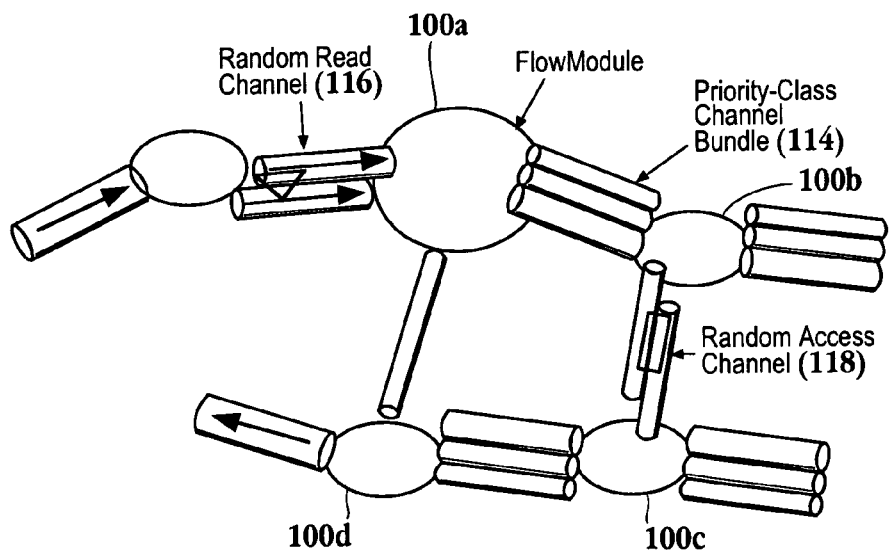
FIG. 2 shows an alternative structural view to the FlowLogic system in accordance with one embodiment of the invention.

FIG. 2 shows an alternative structural view to the FlowLogic system in accordance with one embodiment of the invention. FlowModules 100a through 100d are interconnected through a set of Arcs or Channels. These Arcs or Channels of FIG. 2 may be classified as Random Read Channels 116, Priority Class Channel 114, or Random Access Channel 118, in accordance with one embodiment of the invention. As mentioned above, the FlowModules are mainly composed of memory regions and Channels 114, 116, and 118 provide the wiring for communication between these memory regions. It should be appreciated that different types and capacity channels are inferred interactively from a Flow- Logic description via annotations. For example, Signal types carry attributes that determine the range of priority-class, type and capacity of the Channel. A set of Arcs between two FlowModules map into one or more virtual Channels depending on the Signal types that the Arcs carry. A Channel can be thought of as a uni-directional memory element with Flow-Methods for producer writes, consumer reads, and synchronization and flow control. In the simplest case, a Channel may be a first-in-first-out (FIFO) serial queue. In another embodiment, a Channel may be serial-write, random-read for the purposes of filtering and classification functions. In yet another embodiment, a Channel may comprise random-write and random-read ability to exchange semaphores.

Figure 3:
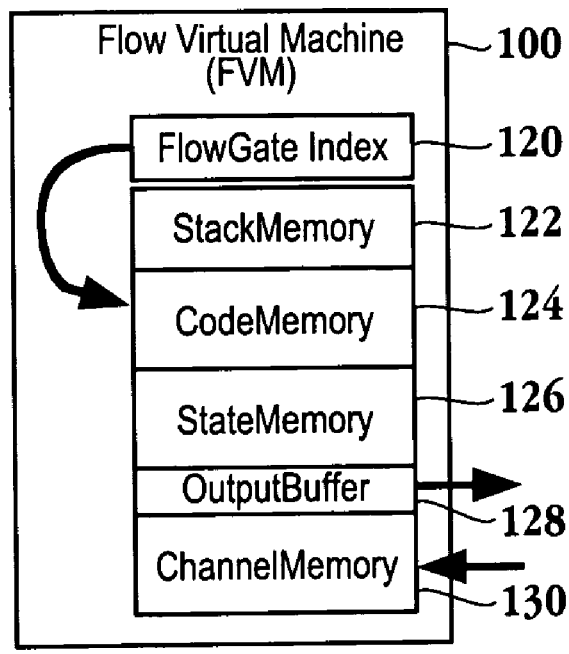
FIG. 3 is a simplified schematic diagram illustrating an architectural view for the execution of a FlowModule in accordance with one embodiment of the invention.

FIG. 3 is a simplified schematic diagram illustrating a logical view for the execution of a FlowModule in accordance with one embodiment of the invention. It should be appreciated that the embodiments described herein take an object and translate that into a FlowModule, which is then further translated into a FlowVirtualMachine (FVM). FlowVirtualMachine 100 represents the execution model of a FlowModule. FVM 100 includes FlowGateIndex 120. In one embodiment, a Signal will hit a FlowModule and through the FlowGateIndex it is determined which FlowGate to execute. In one embodiment, the data within the Signal itself will identify the FlowGate to pick up. StackMemory 122, CodeMemory 124, StateMemory 126, OutputBuffer 128, and ChannelMemory 130 are further included in FVM 100. OutputBuffer 128 is a relatively small memory area for temporarily staging outgoing Signals. ChannelMemory 130 is on the input side for receiving messages into FVM 100. It should be appreciated that each portion of the memories within FVM 100 is shared or aggregated by FlowGates with the exception of Code-Memory 124. Thus, when a Signal hits a FlowGate, as mentioned above, there is a pointer to invoke the FlowGate code. It should be appreciated that FIG. 3 depicts a model that directly determines the characteristics required for mapping to a field-configurable semiconductor device. For the purposes of describing the preferred embodiment of this invention, it is sufficient to talk about the architectural aspects of FVM rather than the details of execution. The variable components of a FVM are the memory partitions and their contents, by varying which any FlowModule can be mapped and executed on it.

It should be noted that the sizes of the logical memory partitions in an FVM are arbitrary and the partitions have physically independent access paths. The code related to FlowGates and FlowMethods is compiled into relocatable machine code which in-turn determines the logical size of the corresponding FVM CodeMemory. The FlowGateIndex contains a jump table indexed on unique FlowGate identifier along with the pointer to the FlowGate code, among other context data for proper FlowGate execution. The Stack-Memory is used for storing intermediate states as required during the FlowGate execution. There are no register files in the FVM. The working of the FVM is analogous to that of a stack machine. The Stack is always empty before a FlowGate starts since the FlowGate by itself does not have a persistent state, and the FlowGate is not allowed to suspend.

The size or the depth of the Stack is determined at compile-time by the FlowLogic compiler. As may be evident, Flow-Logic programming style does not support nested calls and recursive function calls whose depths are not predictable at compile-time. Furthermore, there is no dynamic allocation or garbage collection in FlowLogic because memory resource allocations are fixed at compile-time. Other than temporary variables whose life times span the FlowGate call, State variables are all pre-allocated at compile-time. The size of the StateMemory 126 for a FVM is well known at the compile time. OutputBuffer 128 and ChannelMemory 130 are managed by the run-time system and are visible to the system designer only via annotation in one embodiment. Output-Buffer 128 is a small memory area for temporarily staging outgoing Signals. ChannelMemory 130, on the other hand, hosts the Channels and is as large as is required by the corresponding FVM. It is useful to point out at this time that although these memories have different access data paths, the memories all use the same resource types in the structurally configurable in-memory processing array. In fact, memories are the only resources directly allocated in the array, with other necessary logic, including processing elements, being fixed to such memory resources.

Figure 4:
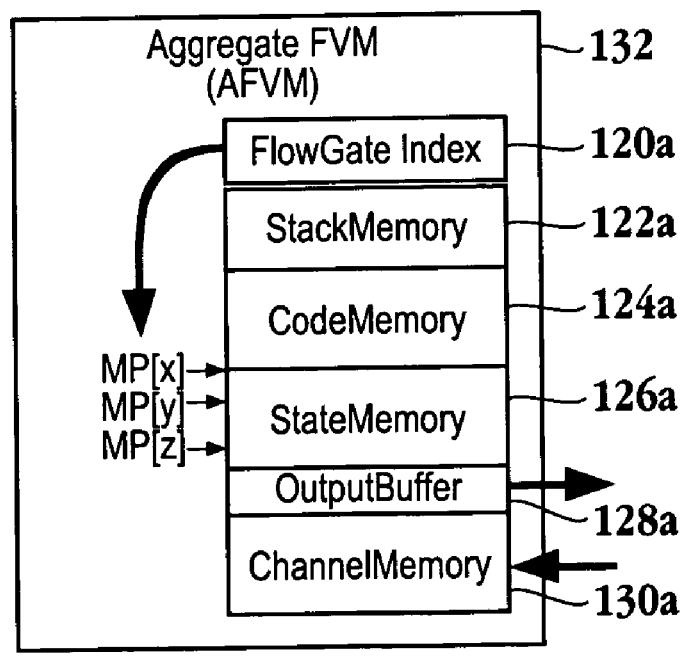
FIG. 4 is a simplified schematic diagram illustrating the ability to aggregate several FlowModules into one aggregate structure in accordance with one embodiment of the invention.

FIG. 4 is a simplified schematic diagram illustrating the ability to aggregate several FlowModules into one aggregate structure in accordance with one embodiment of the invention. Here, multiple FVMs are aggregated and placed into what is referred to as a FlowTile. Aggregate FVM 132 includes a similar structural representation as an individual FVM, i.e., FlowGateIndex 120a, StackMemory 122a, Code-Memory 124a, StateMemory 126a, OutputBuffer 128a, and ChannelMemory 130a. Module pointers (MP) x, y, and z are pointers pointing to corresponding StateMemory areas of the aggregated FlowModules. It should be appreciated that Flow-GateIndex 120a will now index into the CodeMemory, as well as the StateMemory, since multiple FlowModules have been aggregated together. It should be appreciated that the ability to aggregate several concurrent FlowModules into one aggregate is a distinguishing factor behind the FVM architecture. The StackMemory size is the maximum of the Stack-Memory sizes of the individual FVMs. CodeMemory 124a is the sum of the code memories of the aggregated FVMs. However, in one embodiment, CodeMemory 124a may be shared among different FlowModules, resulting in a total size that is smaller than the sum. In the particular case, where multiple FlowModules of the same type are replicated for load sharing, CodeMemory 124a may even contain a single code copy shared among multiple instances. OutputBuffer 128a and the ChannelMemory 130a blocks are managed by the run-time system, in a fashion largely transparent to the application.

Figure 5:
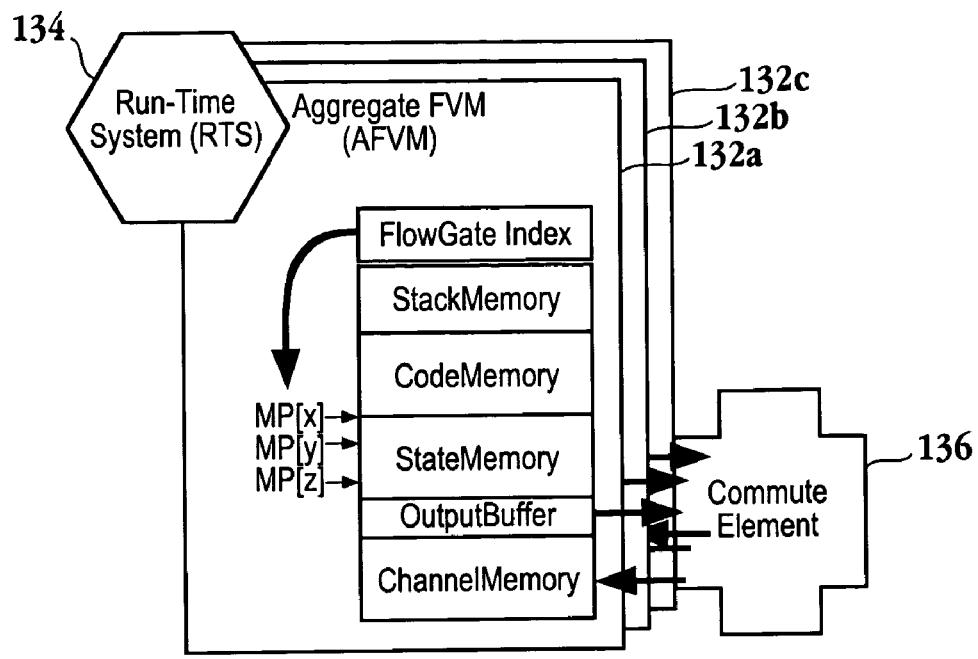
FIG. 5 is a high-level schematic diagram illustrating a FlowTile that supports a corresponding set of virtual processors in accordance with one embodiment of the invention.

FIG. 5 is a high-level schematic diagram illustrating a FlowTile that supports a corresponding set of virtual processors in accordance with one embodiment of the invention. In this representation, the FlowTile is composed of aggregate FVMs 132a, 132b, and 132c. Run-time system 134 functions to determine which Signal is associated with which Flow-Gate. Thus, run time system 134, which may be referred to as a kernel, will coordinate the flow of Signals within the FlowTile. Commute element 136 functions to move Signals into and out of the FlowTile. In one embodiment, Commute element 136 may be thought of as an interface or a router for the various Signals being transmitted. Of course, the router functionality is illustrated here as being internal to the system, however, the router functionality may alternatively be external to the FlowTile in another embodiment. As shown in FIG. 5, multiple AFVMs are mapped to a FlowTile that supports a corresponding set of virtual processors. A FlowTile is a physical entity that has a certain total number of memory resource units. The sum of the resources required by the AFVMs cannot exceed this total. Within this constraint, memory units can be mapped flexibly to serve the functionality of the constituent FlowModules. A FlowTile has a corresponding Runtime System, which coordinates the flow of Signals within the FlowTile. As mentioned above, the Commute element is responsible for moving Signals out of the OutputBuffer and into the corresponding ChannelMemory.

Figure 6:
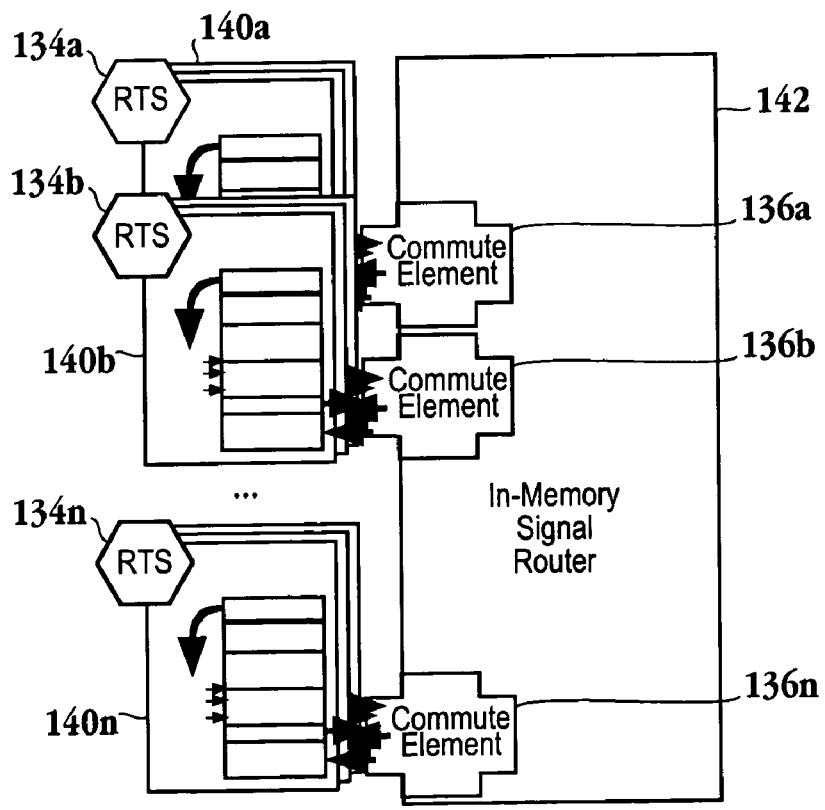
FIG. 6 is a high-level simplified schematic diagram illustrating an architectural view of a FlowLogicMachine in accordance with one embodiment of the invention.

FIG. 6 is a high-level simplified schematic illustrating an architectural view of a FlowLogicMachine in accordance with one embodiment of the invention. Here, each FlowTile 140a through 140n is connected to in-memory Signal router 142 through corresponding commute elements 136a through 136n. It should be appreciated that in-memory Signal router 142 performs routing functionality within the chip that the FlowLogicMachine is designed for. Within each FlowTile 140a through 140n, the coordination of Signals is performed by run-time systems 134a through 134n, respectively. FlowTiles 140a-n are connected to the application independent in-memory router 142 for routing Signals within the FlowLogicMachine. Memory router 142 includes Commute elements 136a-n associated with every FlowTile. In one embodiment, the in-memory router 142 is sufficiently over-provisioned to ensure that Signals flow out of the Output-Buffer and in-memory router 142 without causing blockages, and with minimal transit time. If there is a blockage, the blockage is constrained to the ChannelMemory, where it manifests as a system characteristic, which can be appropriately alleviated at the level of the FlowLogic design representation. As mentioned above the router functionality may also be performed externally. In one embodiment, the run-time system ensures that Signals are created only if the receiving Channel has sufficient credits, ensuring that the worse case behavior of deadlock, over-run etc. does not occur. The overhead of credit based flow control management is tunable at the FlowLogic design representation level by providing adequate Channel sizing attributes. Commute elements 136a-n further breaks up Signals into small flow control digits (Flits) ensuring that end-to-end latency is not sensitive to Signal sizes.

Figure 7:
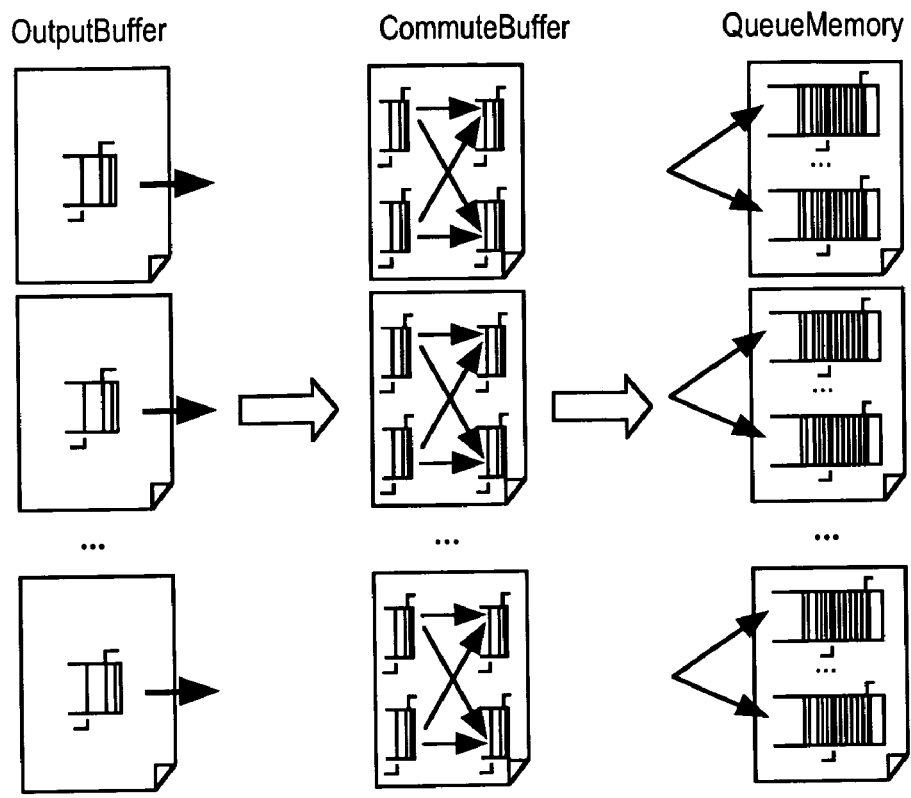
FIG. 7 is a simplified schematic diagram illustrating the data flow within a FlowLogicMachine in accordance with one embodiment of the invention.

FIG. 7 is a simplified schematic diagram illustrating the data flow within a FlowLogicMachine in accordance with one embodiment of the invention. The OutputBuffer for a FlowTile originating a Signal will forward that Signal to the Commute element, where a larger message may be broken up into smaller chunks and passed through intermediate stages. These smaller chunks are then accumulated in ChannelMemory, which is in a FlowTile consuming the data in one embodiment. Signals from the OutputBuffer are independently read out by the Commute element and segmented into Flits, which are the flow control digits or primitives.

Figure 8:
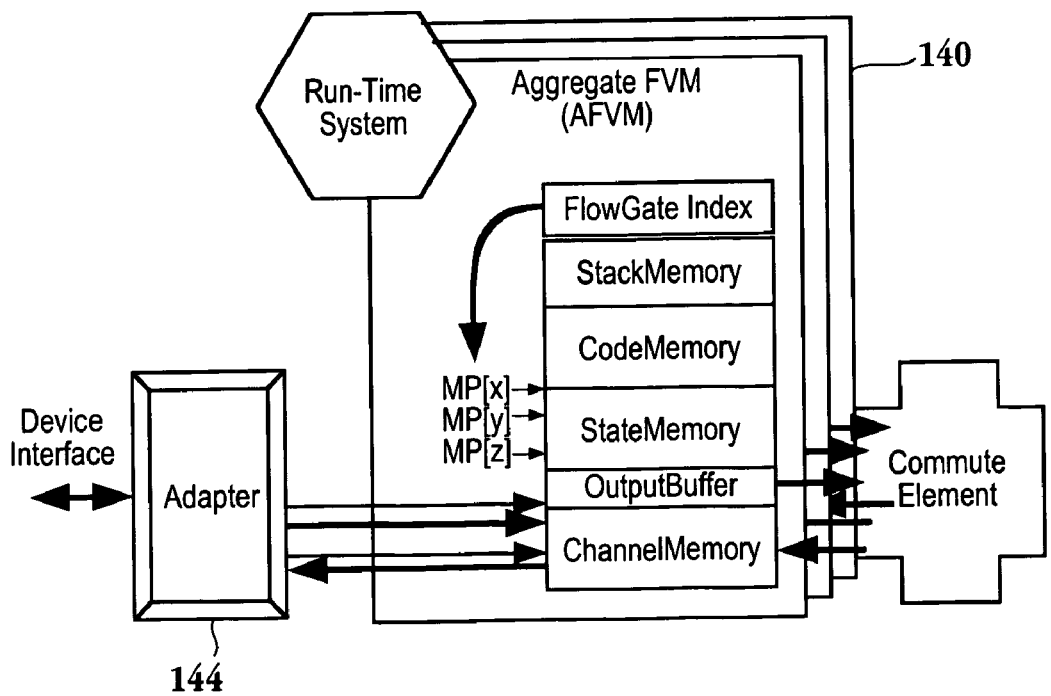
FIG. 8 is a simplified schematic diagram illustrating a FlowTile having an Adapter to interface with an external device to the FlowTile in accordance with one embodiment of the invention.

FIG. 8 is a simplified schematic diagram illustrating a FlowTile having an Adapter to interface with an external device to the FlowTile. FlowTile 140 is in communication with Adapter 144. Adapter 144 can provide an interface for chip-to-chip communication in accordance with one embodiment. For example, Adapter 144 may provide a packet interface in order to transfer packets between devices. It should be appreciated that the Adapter can be designed so that the interface is application-specific. In one embodiment, some of the FlowTiles, e.g., on the periphery of the array, are configured to interface with the external world, e.g., other chips. The interface for the external world is also a Signal based interface that is accomplished through Adapter 144 as shown in FIG. 8.

The FlowLogicMachine can itself be thought of as an array of structurally configurable memory units that implements a plurality of FlowTiles, where the computational logic is fixed and distributed. As a further analogy, the FlowLogic language described herein may be thought of as the JAVA language, while the FlowLogicMachine may be analogized to the JAVA Virtual machine, since the FlowLogic Language has some attributes of object oriented programming languages. For one skilled in the art, it should be appreciated that much of the resources in question are memory units in one form or another, i.e., code, state, stack, channels, and buffer. Motivated by the above observation, the FlowLogicMachine is designed to provide the ability to configure these memory units, also referred to as memory resources, as required by a particular application and the FlowLogic representation allows the flexibility of re-casting a system description in flexible ways to achieve the targeted capacity, performance, and functionality.

Figure 9:
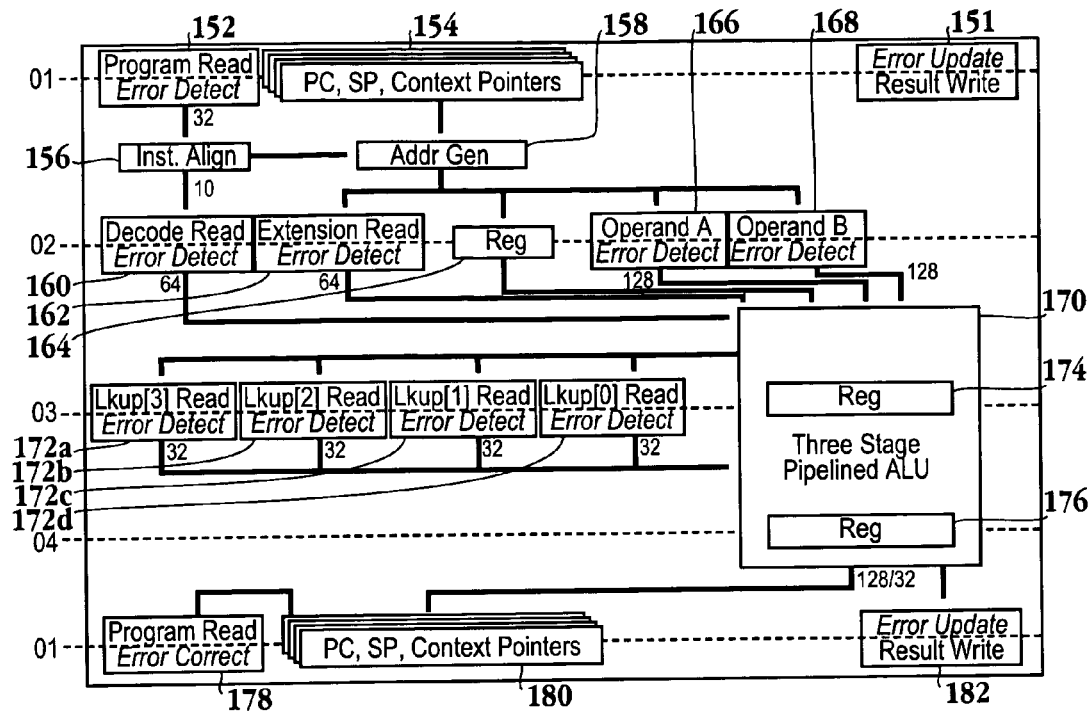
FIG. 9 is a simplified schematic diagram illustrating the data path of a Compute element of a FlowTile in accordance with one embodiment of the invention.

FIG. 9 is a simplified schematic diagram illustrating the data path of a Compute element of a FlowTile in accordance with one embodiment of the invention. FIG. 9 may be thought of as illustrating the processing portion of an arithmetic logic unit (ALU) of the processor for a FlowTile. In this exemplary embodiment, the FlowTile includes four virtual processors, i.e., four stages of the pipeline therefore four threads are illustrated with FIG. 9. However, one skilled in the art will appreciate that any number of processors and threads may be linked as the invention is not limited to four virtual processors. Thus, on the left-hand side of FIG. 9, the numerals 01, 02, 03, 04 and 01 represent stages for a time element within the processing stage. Within the first stage an instruction-read is performed, as illustrated by blocks 152, 154 and 151. The read is performed and an error detection is executed. The instructions are aligned through block 156 and addresses are generated through block 158. These addresses from block 158 are provided for memory accesses and used as data in blocks 162, 164, 166 and 168 of stage 2. In stage 2, the decode is performed and an extension read is also executed as illustrated through blocks 160 and 162, respectively. The operands are delivered to a three-stage pipeline ALU 170. As illustrated, operand A 166 and operand B 168 are delivered to ALU 170, which includes registers 174 and 176, after error detection has been performed. In stage 3, the look-up functionality is performed. Here, one or more of the operands to the ALU 170 may be taken and used as address bits into four memories. The data may then be read out of the corresponding look-up tables 172a through 172d. The cycle will then repeat as illustrated by blocks 178, 180, and 182. It should be appreciated that the architecture within the processing piece of the ALU 150 is a memory centric processor. Each of the memories of modules 152, 151, 160, 162, 166, 168, 172a through 172d can be shared. Thus, the amount of memory allocated to each one of the above-mentioned modules can be changed. That is, the memory allocated to the modules is configurable and there are many access paths into the multiple level arrays of memory storage elements, as opposed to traditional processors, where there are a few access paths to fixed size memories. In addition, the memory references represented by modules 152, 151, 160, 162, 166, 168, 172a through 172d are unique in that traditional processor architecture does not incorporate these features via multiple independent access paths.

In one embodiment of the present invention, Compute element 150 of FIG. 9 is adapted for efficient implementation of the functionality of the FlowModule. Unlike traditional processors, a plurality of memory access paths is an integral part of Compute element 150. The Compute logic gates and registers are robustly designed to minimize sub-threshold leakage arising from static complementary metal oxide semiconductor (CMOS) structures as further illustrated with reference to FIG. 18. The physical extent of combinational logic and registers is minimized and speed matched to work efficiently within the surrounding fabric of configurable memories. In one embodiment, the data path is split into four phases running up to four independent and concurrent virtual processors. As mentioned above, the invention is not limited to four virtual processors, as any suitable number of virtual processors may be incorporated. These virtual processors are in a sense similar to hyper threads, however, the memory resources used by them are completely disjoint, hence the term virtual processors. FIG. 9 depicts the entire data path of Compute element 150 as there are no caching hierarchies, virtual memories or shared memories typically present in prior art processors or multi-processors. In one embodiment, the virtual processors may be associated with separate partitions of the multi-level memory. Alternatively, the virtual processors may share some overlapping portions of the multi-level memory array. In one embodiment, one of the virtual processors will handle system functionality, such as scheduling, exception handling, credit sharing, network functions, etc. The memory access paths, which may also be referred to as access data paths, include the following:

Program Read 152: The control code is read from the stored program control memory. The instruction size is fixed to be 32 bits wide in one embodiment. There is an instance of a program counter for each one of the virtual processors and some portion of the instruction is used to identify the operands and operand selection mode. The instruction is aligned and operand addresses are generated. Compute element 150 depends extensively on context pointers for generating relative addresses. The address offsets in the instruction itself have a dynamic range in accordance with the size of the bit field each occupies.

Decode Read 160: This is the micro-program read that decodes the program code into control states for controlling the computation operation. In a sense, the architecture of Compute element 150 defies the principles of Reduced Instruction Set Computer (RISC) design by resorting back to microprogram based control. The microprogram decode is programmable, in that certain instances of Compute element 150 may have application dependant optimizations of the microprogram control store.

Extension Read 162: This field is used to customize a control instruction in the second step or pipeline stage. In particular, extension read 162 generates operand masks as required for bit manipulations, in the context of transaction-oriented processing. Typically, the extension reads are templates that are generated on an application specific basis and are referenced by the primary instructions.

Operand A&B Read 166 and 168, respectively: The two operands are read from the addresses generated by the address generator 158.

Look Up[0-3] 172a-d: There are four optional lookup memory partitions that enable a special class of instructions called the "Memory Extensible Instructions." These instructions are application dependent and hence the look up memories can be optionally configured for each Compute element 150. These instructions accelerate algorithms such as encryption, authentication, hashing, cyclic redundancy checks and multiplication among others, used in transaction-oriented applications. The operands are used to generate the addresses for the four lookup partitions and the resulting four lookup outputs, up to 128 bits each, are combined together in ALU 170 to generate the output.

Result Write 182: The resulting output from ALU 170 is then written into the corresponding memory partition via the access path of result write 182.

ALU 170: Often times the result of ALU 170 is used to update an internal register or the next control state of the program. It should be noted that there is no branch prediction or any other form of instruction-level-parallelism enhancement techniques. The architecture of Compute element 150 once again defies the premise of RISC. Compute element 150 does have several complex instructions operating on anywhere from 32 to 128 bit data paths, which are optimized for stateful, transaction-oriented applications. ALU 170 is a three stage pipelined unit in one embodiment. As shown in FIG. 9, two of those stages are shared with memory accesses. The instruction set is described later with reference to FIG. 14.

The embodiments of the present invention are particularly designed to address noise-induced errors and soft-errors plaguing deep semiconductor memory technologies. Noise sources include crosstalk and coupling. In a reasonably designed system, soft-errors are rare, but inevitable. Compute element 150 detects single-bit errors on all the read access paths 152 and 178, but does not expend combinational logic in correcting the error. Compute element 150 is designed to go into an exception mode, where the error is corrected programmatically at the cost of compute cycles. In a sense, this is similar to a hardware interrupt. In fact, Compute element 150 does not have any other forms or use of interrupts in the embodiments described herein. In the embodiment described herein data is organized in bytes each with its own parity bit enabling error detection at the byte level. Furthermore, a block of 16 bytes including the parity bits is protected by a 9-bit syndrome enabling single-bit error correction at the block level.

Figure 10:
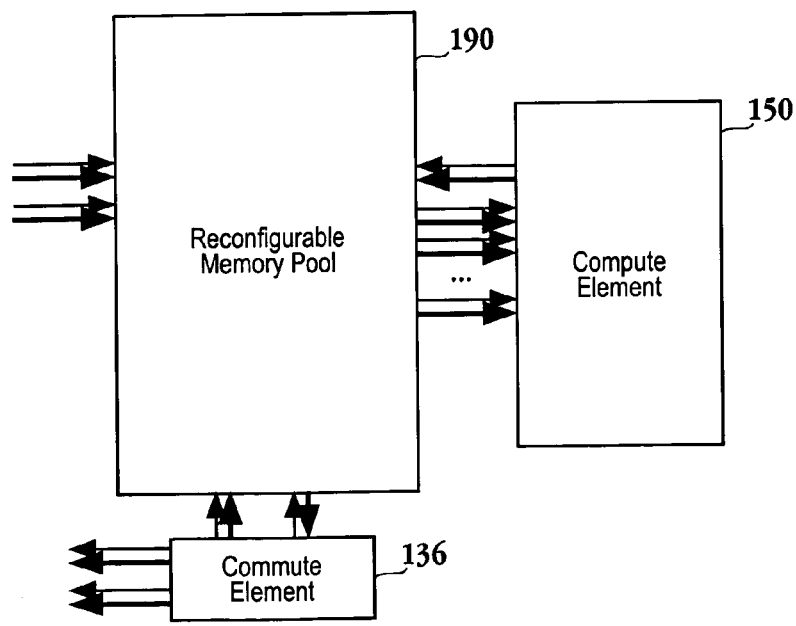
FIG. 10 is a simplified schematic diagram illustrating the relationship between the memory partitions, the Compute element of FIG. 9 and a Commute element in accordance with one embodiment of the invention.

FIG. 10 is a simplified schematic diagram illustrating the relationship between the memory partitions and the Compute element of FIG. 9 in accordance with one embodiment of the invention. As illustrated, Compute element 150 has a reconfigurable memory pool 190, which is also in communication with Commute element 136. It should be appreciated that Compute element 150, reconfigurable memory pool 190, and Commute element 136 may also be referred to as a FlowTile. Reconfigurable memory pool 190 represents a pool of structurally configurable memory elements providing access paths to the Compute element 150. In one embodiment, memory elements, access paths and Compute element 150 are bit-aligned and pitch matched. These elements are field configured in an application specific fashion to suit each instance of the Compute element 150. Commute element 136 and Compute element 150 are associated with corresponding portions of memory pool 190 and those portions may be reconfigured.

Built-In Silicon Test & Repair: A Substantial part of the semiconductor device includes the configurable memory pools. Since other elements do not occupy a significant percentage of the device die, they are designed robustly with respect to potential manufacturing defects. Memory pool 190 is tested in-silicon and configured to eliminate defective portions of the memory units in an application independent fashion. In one embodiment, much of this operation is performed programmatically on power up. The memory pools are then configured appropriately to suit a given application. The memory pool also provides independent read accesses to a resident Commute element and independent write accesses to neighboring Commute elements. As mentioned above, Commute elements 136 of FIG. 10 are responsible for commuting Signals from one portion of the device to another.

Figure 11:
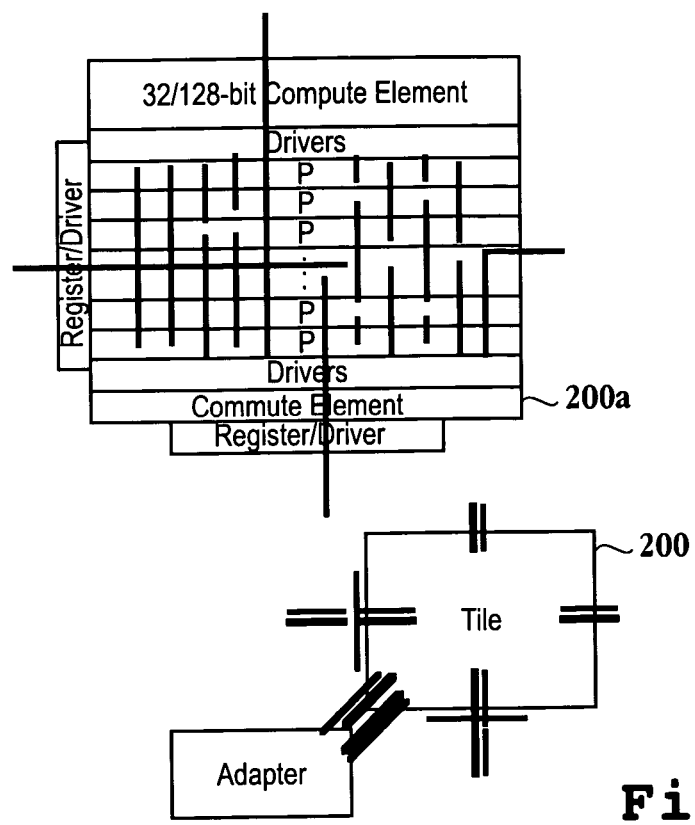
FIG. 11 further illustrates the topological position of a Compute element of FIGS. 9 and 10 and the Commute Element of FIG. 10 in the context of a structurally configurable in-memory processing array in accordance with one embodiment of the invention.

FIG. 11 further illustrates the topological position of a Compute element of FIGS. 9 and 10 and the Commute Element of FIG. 10 in the context of a structurally configurable in-memory processing array in accordance with one embodiment of the invention. FIG. 11 shows an elemental FlowTile 200 of the device. As can be seen in more detail in FlowTile 200a, there is an arrangement of configurable access paths to pages (P) of memory over the memory array with Compute element 170 embedded in a pitch-matched fashion.

Figure 12:
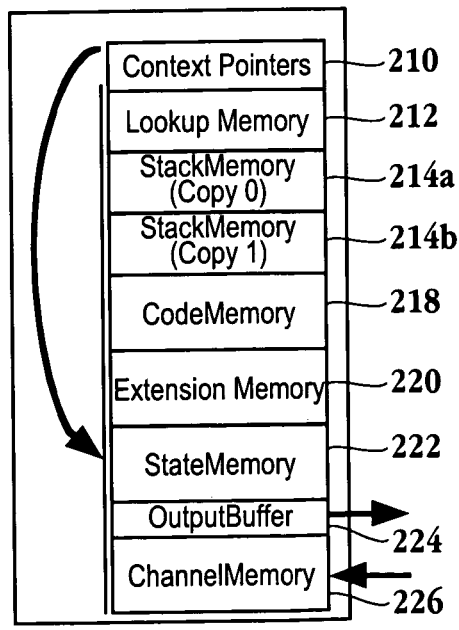
FIG. 12 illustrates the architectural model of the Compute element in accordance with one embodiment of the invention.

FIG. 12 illustrates the architectural model of the Compute element in accordance with one embodiment of the invention.

As shown, Context Pointers 210 are included since most processing required by the FlowLogic architecture is object-oriented and is relative to a small dynamic range of addressing. Context Pointers 210 point to several configurable size memory partitions as described below in more detail:

LookupMemory 212: This partition of memory is optional and can use 1, 2 or 4 of the access paths shown earlier. The contents of LookupMemory 212 are programmed typically at configuration time as required by the application. Portions of lookup memory 212 can also be metal-programmed during manufacturing.

Figure 13:
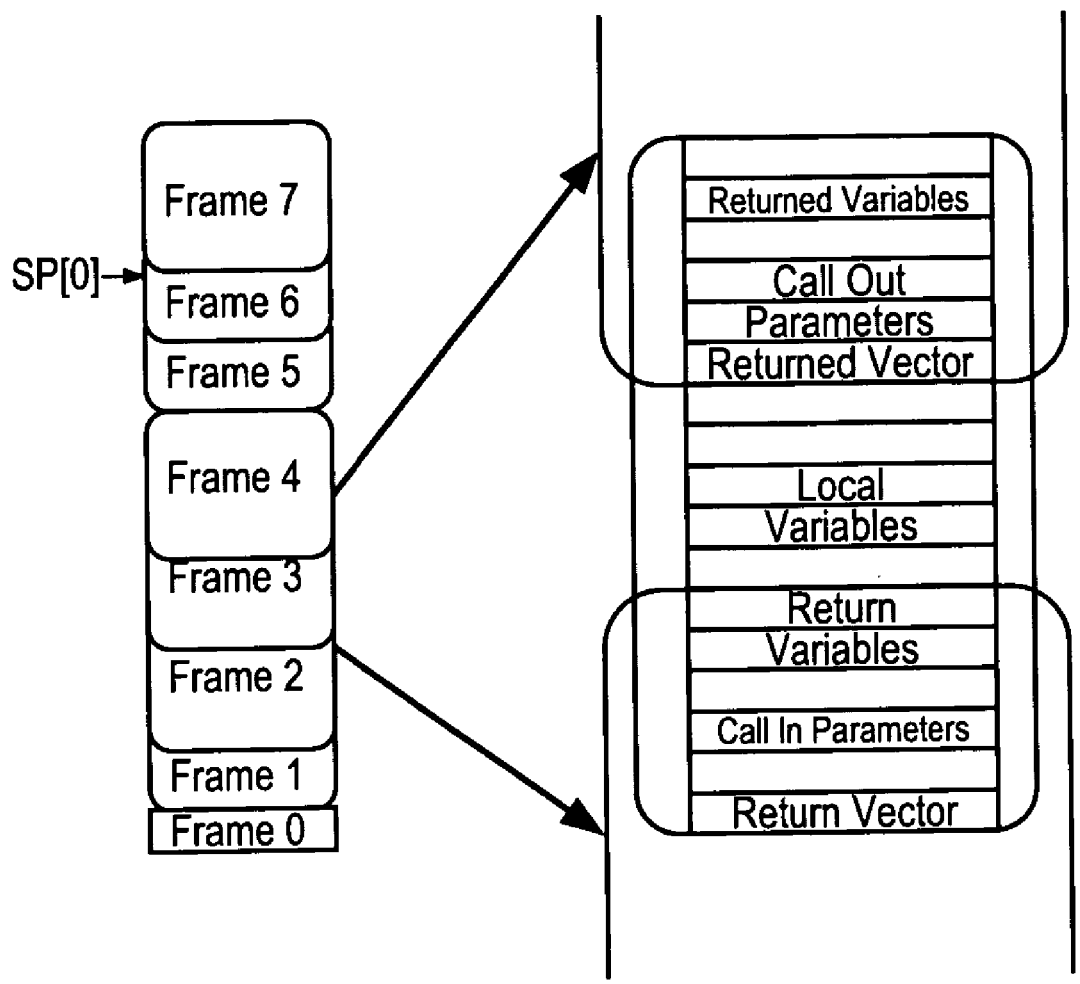
FIG. 13 is a simplified schematic illustrating an exemplary StackMemory in accordance with one embodiment of the invention.

StackMemory (Copy 0 and 1) 214*a* and 214*b*, respectively: The execution model of the Compute element can be analogized to a stack machine. The Compute element does not have the notion of register files or virtual memories. All the required memory is pre-allocated at the compile or personalization time in one embodiment. StackMemory 214*a* and 214*b* serves as temporary storage of run-time state of the FlowGate. FlowGates in FlowLogic are so specified that the maximum Stack size required for an application can be determined at compile time. The partition is made sufficiently large to house the deepest stack as determined by the compiler. FlowLogic does not support the notion of recursive function calls to ensure that the Stack does not overflow in one embodiment. FIG. 13 illustrates usage of the Stack Memory as the FlowGate is executing and making nested function calls therein.

There is an optional second copy of the StackMemory which is a mirror image of the original copy. This arrangement is used in one embodiment to make the contents of the Stack available as either operand to the ALU. The two copies of the StackMemory however get written into simultaneously. The compiler in some cases may choose not to use the second copy. But often times, Stack Memories are substantially smaller, but the variables stored in the Stack tend to get used frequently. It should be appreciated that the StackMemory is the replacement for register files in traditional RISC processors.

CodeMemory 218: Much of the program code relates to FlowGates, which are relocatable and contextual. The CodeMemory partition can be configured to any arbitrary size like other partitions. Multiple virtual processors can share some of the code as required. Portions of CodeMemory 218, especially those relating to power on repair can be metal-programmed at the time of device manufacture. The rest of the application dependent code is typically programmed at the configuration time in one embodiment. In some special cases, such as exception handling, this partition can also be programmed at run-time in an exception specific way.

ExtensionMemory 220: This is a much smaller optional partition that is used to customize instances of instruction, typically providing masks and alignments and other control/data parameters to the ALU.

StateMemory 222: This is a memory partition where the FlowModule states are stored and operated upon. All the allocations into state memory 222 are made at the compile time. As mentioned previously, there is no dynamic heap storage allocation or garbage collection in FlowLogic.

Output Buffer 224: This is a relatively small partition, where the Compute element writes to, but does not read from. The Commute element typically reads out from this partition.

Channel Memory 226: This is typically a flexible partition which may be very small in some cases and large in others. Signals are deposited into this partition by the Commute element. The Compute element only has read access to this partition.

FIG. 13 is a simplified schematic illustrating an exemplary StackMemory in accordance with one embodiment of the invention. As explained earlier, the threads executing FlowGates do not have a state of their own at any point in time. A FlowGate and its nested FlowMethod calls use the Stack Memory as the code is running. As a result the Stack grows. The FlowLogic compiler ensures that the Stack will never grow beyond its pre-allocated size in any case.

FIG. 14 illustrates the instruction set architecture of the Compute element in accordance with one embodiment of the invention. It should be noted that in the preferred embodiment the instruction set is programmable, in such a fashion that the instruction set can be made compact for a given instance of application. One skilled in the art will notice that the Compute element depends on domain specific pointers to minimize the dynamic range of the operand addresses for most frequently used instructions. For less frequently used instruction however, a much larger dynamic range is feasible at the cost of multiple instructions to perform a particular operation. The Extension pointer and the corresponding programmable extension provide a richer context to instructions in terms of alignment, shift and masking. The extensions tend to be a small set and application specific.

Figure 15:
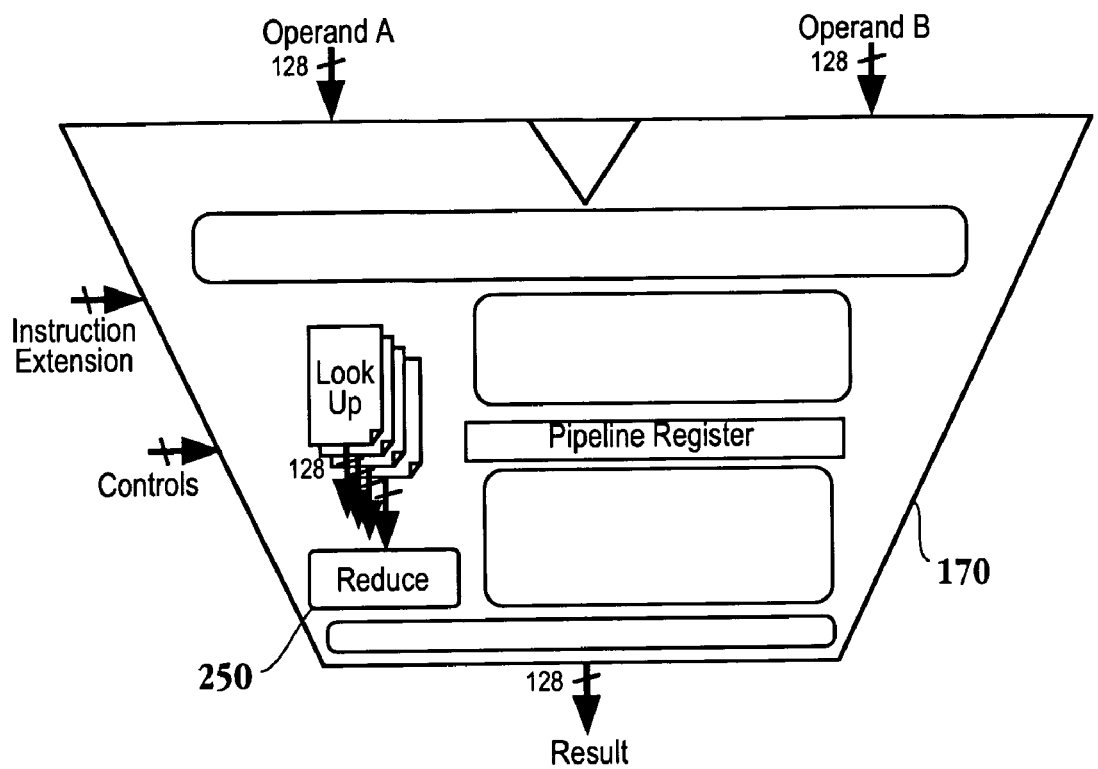
FIG. 15 further illustrates the memory extensible instructions as an extension to the arithmetic logic unit (ALU) in accordance with one embodiment of the invention.

The concept of memory extensible instruction is disclosed by the embodiments described herein. FIG. 15 further illustrates the memory extensible instructions as an extension to the ALU in accordance with one embodiment of the invention. ALU 170 itself is pipelined. Along side the pipeline stage is the optional data path through four instances of LookupMemories. The addresses to these LookupMemories are generated directly from one or more of the operands. These memory partitions output 128 bits each which are then combined in Reduce combinational logic block 250. The contents of the lookup tables are themselves programmable and the reduction algorithm is selected by programming the instruction set appropriately. The reduction operations range from bitwise exclusive-OR, swizzle, and 4-way carry-save combine among others. Some of the useful operations include primitives for generating single cycle hash function, polynomial division as used in cyclic-redundancy check, Advanced Encryption Standard (AES) encryption, authentication etc.

Figure 16:
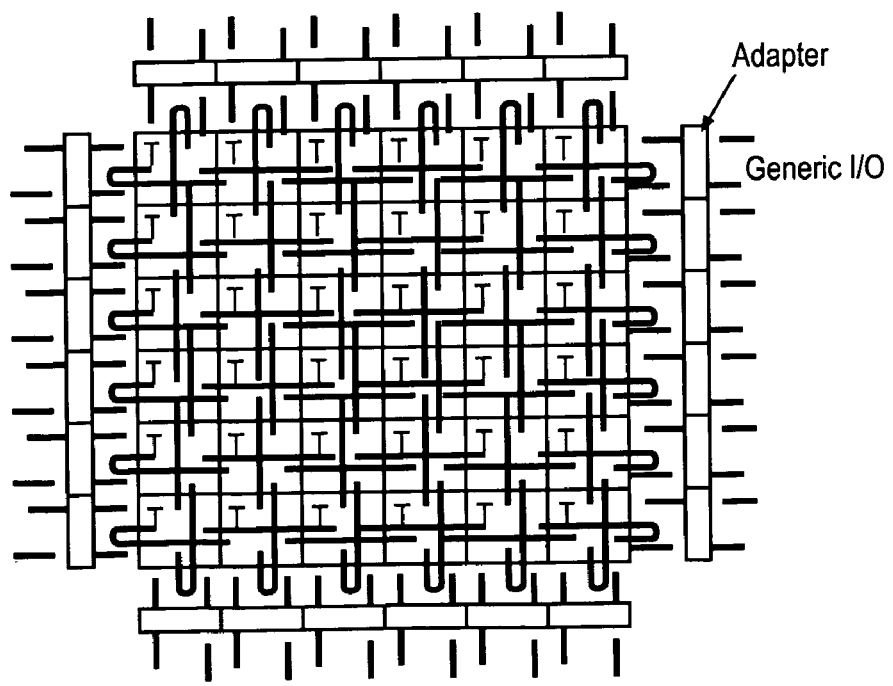
FIG. 16 is a simplified schematic illustrating the in-memory processing die constructed in a scalable fashion by tiling FlowTiles along two dimensions in accordance with one embodiment of the invention.

In one embodiment of the invention, the in-memory processing die is constructed in a scalable fashion by tiling FlowTiles along two dimensions as shown in FIG. 16. The high bandwidth unidirectional inter-FlowTile access paths can take on different network topologies well-known in on-chip interconnection network design, with intermediate memories as network nodes. The Adapters are placed on the periphery of the die to convert from the high bandwidth internal memory paths to lower bandwidth interfaces for die-to-die interconnects. Individual FlowTiles run on mutually skewed clocks to minimize electro-magnetic interference (EMI) in one embodiment. It should be appreciated that the ability to run individual FlowTiles on asynchronous and mesochronous clocks also makes it conducive for an external interface to interface using its native clock. That is, the clock distribution tree between portions of the multiple level array is skewed with respect to one another. As used herein, a portion of the multiple level array is interchangeable with the term "FlowTile." Furthermore, the embodiments described herein allow contemporaneous access to the memory storage cells through the skewed clocks on different read and write access paths. In addition, the interface ports referred to herein may access storage cells within the multiple level array according to an asynchronous clock that is independent of clocks on other access paths to the storage cells. The adapter of FIG. 16 includes the interface ports. The interface ports may be referred to packetized interface ports, which signifies the interface ports are capable of handling/processing packet data.

Figure 17:
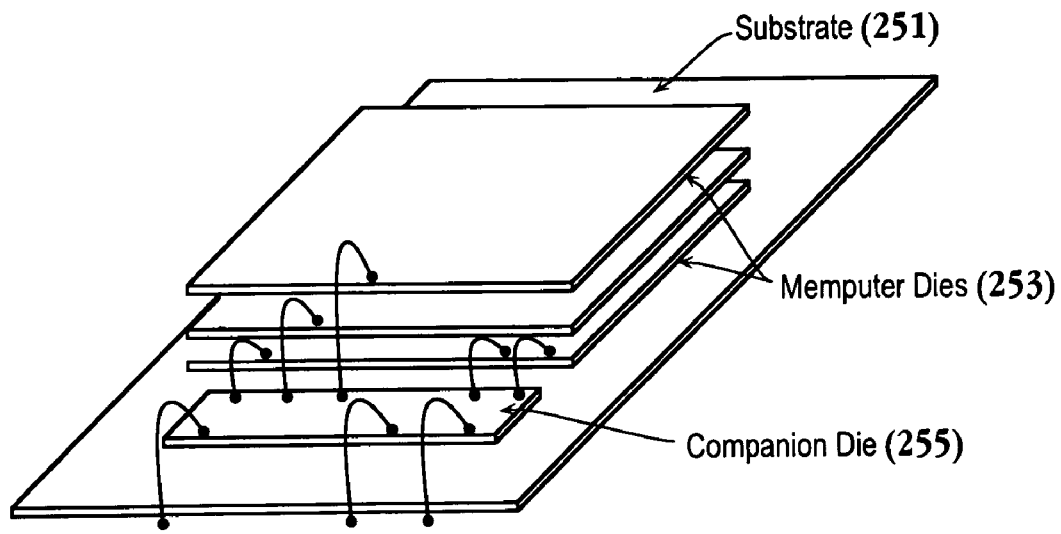
FIG. 17 is a simplified schematic diagram illustrating a system-in-package (SIP) device wherein one or more instances of device described herein are interfaced with one or more companion dies in accordance with one embodiment of the invention.

The in-memory processing device is realized using a system-in-package (SIP) device wherein one or more instances of an in-memory processing array die are interfaced with one or more smaller companion dies 255 on substrate 251 as illustrated in FIG. 17. The external interfaces are typically serial interfaces from companion die 255. Companion die 255 is a mixed-signal die that includes the physical interface layers in one embodiment. Quite often the mixed signal companion dies are one or two generations behind the in-memory processing array in process technology. The resulting SIP device is typically an application platform where several related applications can be implemented. The in-memory processing die by itself is generic and application independent. In one embodiment, companion die 255 is an analog circuit or has an analog portion thereon.

Figure 18A:
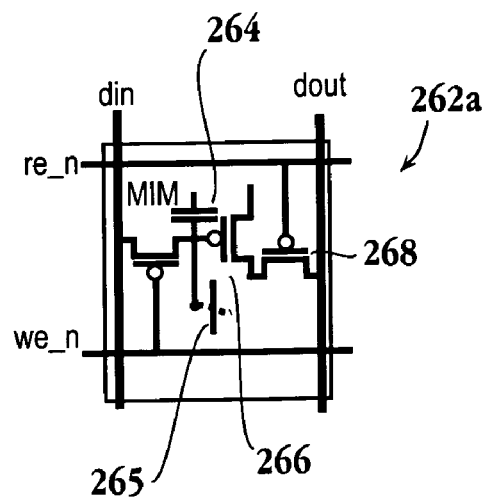
FIG. 18 shows the schematic view of the bit cell in accordance with one embodiment of the invention.
Figure 18B:
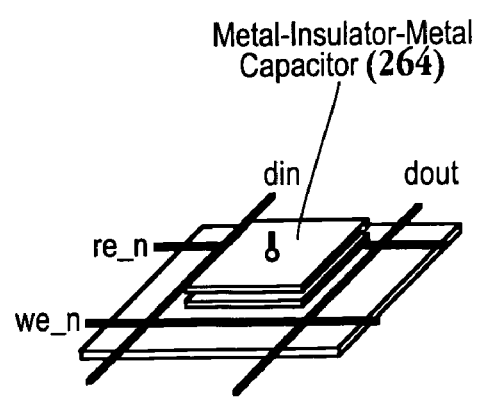

FIG. 18 shows the schematic view of the bit cell in accordance with one embodiment of the invention. As may be noted by one skilled in the art, the metal-insulator-metal (MIM) capacitor acts as the storage element. The storage capacitor is isolated from the read bit line explicitly by isolation transistor 266. Bit cell 262*a* is designed to be accessible asynchronously for read and write. The read and write pulses need not have any known relationship with one another. If there is a resulting read-write conflict, it is resolved at higher levels of logic. P-channel transistors 266 and 268 are configured for writing and reading into bit cell 262*a*. One skilled in the art will appreciate that the p-channel transistors illustrated in FIG. 18 are not meant to be limiting, as the embodiments described herein may incorporate n-channel transistors also. MIM capacitor 264 is constructed at a layer above the active transistors, as is allowed by some of the advanced processes currently available. These types of MIM capacitors 264 are traditionally used in high density dynamic random access memories (DRAMs) where the capacitor needs to be refreshed on a read. The current embodiments use these MIM capacitors 264 to realize dual-ported independent read/write memories, at the cost of lower density. The storage node can also be permanently programmed to a logic one or zero using one metal mask programming, as shown in FIG. 18. It should be appreciated that the resulting larger capacitance from MIM technology and a much reduced SER (Soft Error Rate) cross section from the active diffusion area of a gate region improves soft-error tolerance.

Still referring to FIG. 18, it should be appreciated that the connections for switch 265 is able to be changed through a single mask, thereby enabling a single mask to be used to switch the functionality of the bit cell. For example, if switch 265 is left unconnected, then a traditional memory cell is generated. However, if switch 265 is connected to $V_{dd}$ or ground, then a different type of memory cell is generated. In essence the embodiments described herein enable a technique to layout a memory cell so that hardwiring can be done through changes to a single mask, as opposed to multiple masks in traditional memory cells. Through the embodiments described with regard to FIG. 18, the device has become metal programmable.

Figure 19:
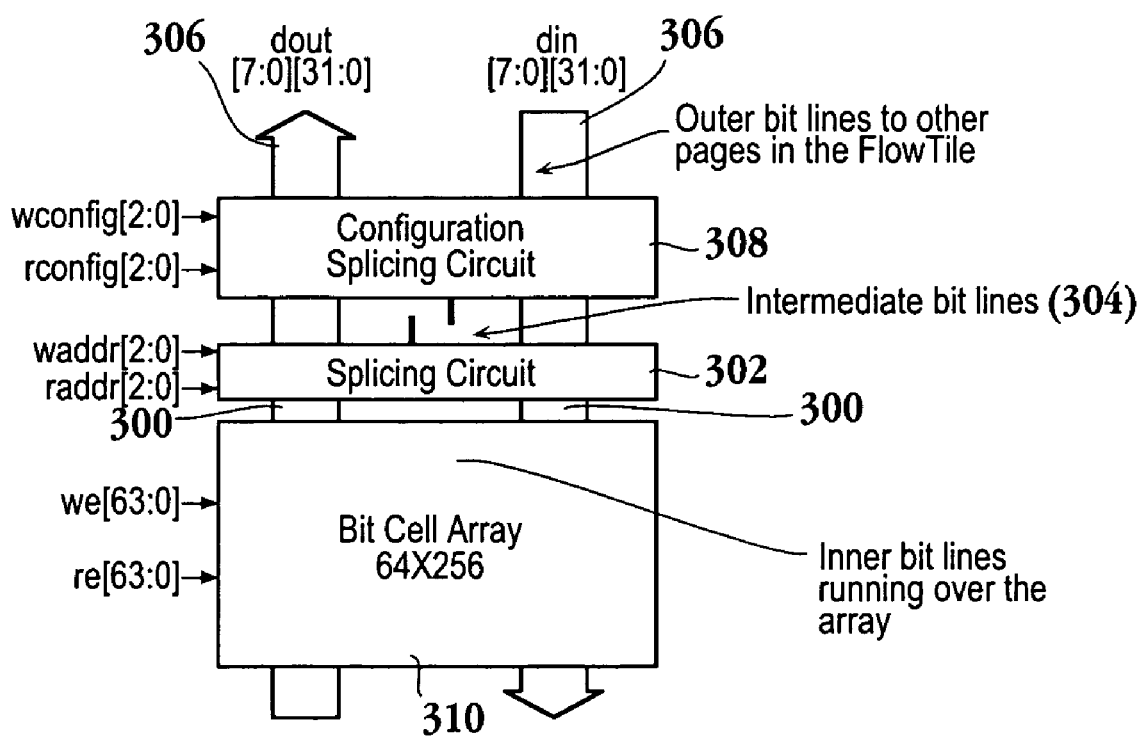
FIG. 19 is the schematic diagram of the bit-line arrangement in accordance with one embodiment of the invention.

FIG. 19 is the schematic diagram of the bit-line arrangement in accordance with one embodiment of the invention. As described in the previous section, the read and write enable controls are generated by separate decoders that may be potentially asynchronous to each other. The read and write bit-lines are independent of one another. The bit lines are organized through three levels of hierarchy namely, an inner bit-line, an intermediate bit-line and an outer bit-line. Inner bit-lines 300 reach down to the bit-cells. Bit-lines 300 are organized into columns. Columns are further grouped together into column groups. There are column splicers 302 embedded within the bit-line to realize fewer intermediate bit-lines 304. Intermediate bit-lines 304 are accessible via one of several external bit-lines 306 based on the configuration, as denoted by the wconfig and rconfig control lines. External bit-lines 306 of several pages within the FlowTile are further bussed together to form the final FlowTile bit-lines with drivers and sense amplifiers on the periphery of the FlowTile. Splicing circuit 302 functions to match the organization of the memory width with the bus width. In one embodiment, splicing circuit 302 is a multiplexer demultiplexer supporting a single cycle operation. Configuration splicing circuit 308 is used for configuring bit cell array 310 so the bit cell array can become a portion of a buffer or a stack. Configuration splicing circuit 308 is tied to the external bus and is fixed once the configuration is done. It should be appreciated that splicing circuits 302 and 308 provide two levels of multiplexing, one level to configure and one level to match the organization of memory with the external bus width.

The memory bit-cells, pages and FlowTiles are designed specifically to enhance semiconductor design yield against defects. The area dominant circuitry is the bit-cell which is designed using aggressive design pitches. To improve yield at this level, each page comprises redundant rows, which can be used to replace rows with defective bit-cells. At the next level of integration relaxed geometries are used to minimize the likelihood of point defects. There are also redundant pages within a FlowTile to compensate for pages that may be defective in spite of bit-cell repairability. The external bit-line and per-page logic is over-designed to be robust against point defects. It should be noted that the embodiments described herein partition a physical design of a circuit device into different hierarchical levels of integration. The different levels include lower level where a defect density is relatively high as compared to the higher levels of integration. For example, at the bit cell level, the defect density is relatively high and thus, the embodiments described herein would provide for higher redundancy since it is preferable to keep feature sizes at a minimum in this level of integration. However, at the level of page integration, the redundancy may be relaxed and defect resilient techniques may be incorporated. In one embodiment, the defect resilient techniques may include using coarse features and spacing features farther apart to reduce the redundancy requirements. One skilled in the art will appreciate that tools currently available do not possess knowledge of circuit levels and solely focus on a minimum spacing criteria between features. The embodiments herein define a set of design criteria that is hierarchical and at each level it is determined which rules apply. That is, at some levels redundancy may be desirable, while at other levels resiliency may be preferable, where resiliency refers to using coarser feature sizes and further spacing features apart to reduce the need for redundant features at that level. Thus, the embodiments described herein base the decision of redundancy versus resiliency on the level of integration rather than solely on the decision to minimum spacing at all levels.

The memory refresh is performed separately for different portions of the in-memory processing array by temporarily stalling the usage of the corresponding access ports. Some memories may not be refreshed if they are either not used or if they belong to a partition which is known to have short mean-time between re-write. In such instance, the application does however monitor the time between re-write to ensure that the bits do not decay.

Figure 20:
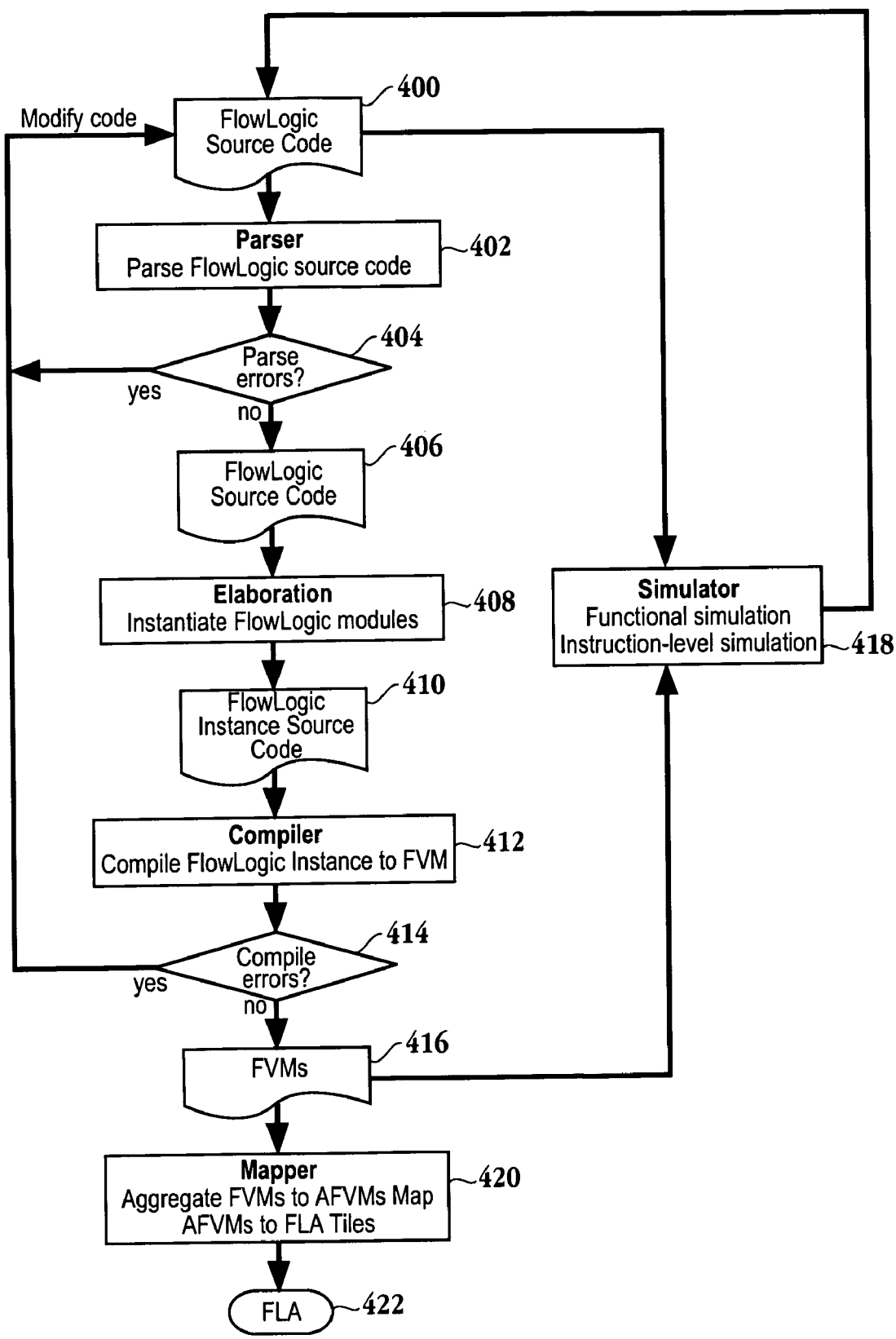
FIG. 20 is a flowchart diagram illustrating the method operations for configuring and programming a semiconductor circuit device having a multiple level array of memory storage cells in accordance with one embodiment of the invention.

FIG. 20 is a flowchart diagram illustrating the method operations for configuring and programming a semiconductor circuit device having a multiple level array of memory storage cells in accordance with one embodiment of the invention. The method initiates with operation 400 where the initial FlowLogic source code is provided. In operation 402, the FlowLogic source code is parsed. In decision operation 404, it is determined whether any errors exist in the source code, e.g., syntax errors. Since FlowLogic supports a subset of C++ in one embodiment, it should be appreciated that this check will reveal any syntax issues. If an error does exist, the method returns to operation 400 and the error is corrected and the method resumes as described above. If there is no error detected, then the method advances to operation 406 where the FlowLogic source code is in a state where some of the code is in a C++ format. In operation 408, the Flowlogic modules are instantiated through an elaboration process. Here, the source code having a description of a network is converted to code representing FlowLogic instances, i.e., a network of instances is provided. This results in the FlowLogic Instance source code as represented in operation 410.

Still referring to FIG. 20, in operation 412, the FlowLogic Instances are compiled into corresponding FVMs. The compiled FVMs are checked for compile errors in operation 414. If there are compile errors found in operation 414, then the method returns to operation 400 and repeats as described above. If there are no compile errors, then the compiled FVMs are made available in operation 416. The compiled FVMs are input into a simulator in operation 418, wherein a functional simulation and an instruction level simulation are performed. It should be appreciated that the source code from operation 400 is used to provide the function level simulation, while the compiled FVMs are used to provide the instructional level simulation. In operation 420, a mapper aggregates the FVMs to AFVMs and maps AFVMs to FLA (FlowLogicArray) Tiles. Here, the mapping of the AFVM is into a portion of the multiple level array of memory storage cells. Additionally, the multi-way access paths of the multiple level array are configured according to the multiple FVMs in operation 420. Thereafter, the portion of the multiple level array is programmed to function according to the multiple FVMs. The method terminates in operation 422 where the FLA (FlowLogicArray) is defined as a chip in silicon.

The embodiments described above provide a memory centric approach for a processing system design and architecture, as well as the FlowLogic language for designing, synthesizing, and placing and routing techniques for this unique processing system design. Terms of the FlowLogic language have been analogized to some object oriented terms for ease of understanding. For example, a FlowGate may be thought of as a Function, Procedure or Task, while a FlowModule may be analogized to an object in object oriented programming. A Signal may be referred to as a message or a packet. It should be appreciated that while these analogies are used for explanatory purposes, there are significant differences between the embodiments described herein and the corresponding analogies.

Traditional processors incorporate the notion of virtual memories to push physical memory away from the processing core. To do so, they introduce accumulators, registers and caching hierarchies. The embodiments described above embrace the incorporation of processing core(s) directly within the physical memory. Furthermore, the data paths in the above-described embodiments are significantly different than the data paths within the traditional processor architecture.

The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, electromagnetic wave carriers, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A structurally reconfigurable semiconductor circuit device for in-memory processing of stateful, transaction-oriented applications, comprising:

a multiple level array of memory storage cells and logic circuits, the storage cells having multiple configurable access paths, the storage cells capable of being simultaneously accessed for being read from and written into;

a plurality of configurable, packetized interface ports capable of receiving data packets, the packetized interface ports having access to the multiple level array;

a plurality of configurable commute elements distributed within the multiple level array, each of the plurality of configurable commute element configured to move data within the multiple level array of storage cells through one of the multiple configurable access paths;

a plurality of configurable Compute elements within the multiple level array, each of the plurality of configurable Compute elements configured to transform data within a portion of the multiple level array of storage cells via the multiple configurable access paths; and a pool of redundant features for repairing a defective feature within the multiple level array, wherein levels of the multiple level array associated with a higher defect density have more redundant features available for repair relative to levels associated with a lower defect density.

2. The device of claim 1 further comprising:
configuration cells hard wired to one of a first or a second logic state.

3. The device of claim 1 further comprising:
a read access path coupled to the memory storage cells to enable a non-destructive read.

4. The device of claim 1 further comprising:
a metal-insulator-metal capacitor provided to increase a charge of a corresponding memory storage cell thereby providing enhanced soft error resiliency.

5. The device of claim 1 further comprising:
an electro-magnetic interference (EMI) reduction apparatus, the EMI reduction apparatus including:
a clock distribution tree such that clock signals between portions of the multiple level array is skewed with respect to one another and wherein contemporaneous access to the memory storage cells is provided through skewed clocks on different read and write access paths.

6. The device of claim 1 wherein an interface port has access to a storage cell within the multiple level array according to an asynchronous clock that is independent of clocks on other access paths to the storage cell.

7. The device of claim 1 wherein a refresh for a memory storage cell within the multiple level array occurs over one of the multiple configurable access paths and is applied selectively to portions of the multiple level array.

8. The device of claim 1 wherein the storage cells are selected from a group consisting of a volatile random access memory (SRAM), a dynamic random access memory (DRAM) and a non-volatile memory.

9. The device of claim 1 wherein the storage cells are accessed for read and write in a time-multiplexed fashion.

10. The device of claim 7 wherein the refresh is performed transparently by dedicated logic.

11. The device of claim 1, wherein the device is capable of being configured to express a stateful, transaction-oriented application as a network of FlowVirtualMachines (FVMs) having an arbitrary number of memory storage cells assigned to the application, wherein multiple FVMs are capable of being linearly composed into an AggregateFlowVirtualMachine (AFVM), and wherein the AFVM is mapped into a FlowTile of the multiple level array.

12. The device of claim 1, wherein the device is included in a multi-chip module package.

13. The device of claim 12, wherein the multi-chip module package includes a mixed signal companion die for serializing one of the plurality of packetized interface ports to a serial interface.

14. The device of claim 1, wherein the plurality of configurable commute elements and the plurality of configurable Compute elements are physically bit-aligned to portions of the multiple level array.

15. The device of claim 1, wherein the memory cells are one of a flip flop, latch, or a capacitor.

16. A structurally reconfigurable semiconductor circuit device for in-memory processing of stateful, transaction-oriented applications, comprising:

a multiple level array of memory storage cells and logic circuits, the storage cells having multiple configurable access paths, the storage cells capable of being simultaneously accessed for being read from and written into;

a plurality of configurable, packetized interface ports capable of receiving data packets, the packetized interface ports having access to the multiple level array;

a plurality of configurable commute elements distributed within the multiple level array, each of the plurality of configurable commute element configured to move data within the multiple level array of storage cells through one of the multiple configurable access paths;

a plurality of configurable Compute elements within the multiple level array, each of the plurality of configurable Compute elements configured to transform data within a portion of the multiple level array of storage cells via the multiple configurable access paths; wherein the device is capable of being configured to express a stateful, transaction-oriented application as a network of FlowVirtualMachines (FVMs) having an arbitrary number of memory storage cells asigned to the application, wherein multiple FVMs are capable of being linearly composed into an AggregateFlowVirtualMachine (AFVM), and wherein the AFVM is mapped into a FlowTile of the multiple level array.

17. The device of claim 1, further comprising:
a pool of redundant features for repairing a defective feature within the multiple level array, wherein levels of the multiple level array associated with a higher defect density have more redundant features available for repair relative to levels associated with a lower defect density.

* * * * *